United States Patent
Ikeda

(10) Patent No.: US 7,077,666 B2
(45) Date of Patent: Jul. 18, 2006

(54) ON-VEHICLE ELECTRONIC CIRCUIT UNIT

(75) Inventor: Tomoki Ikeda, Tokyo (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 11/145,641

(22) Filed: Jun. 6, 2005

(65) Prior Publication Data

US 2005/0272281 A1   Dec. 8, 2005

(30) Foreign Application Priority Data

Jun. 7, 2004   (JP) .............................. 2004-168789

(51) Int. Cl.
*H01R 12/00*   (2006.01)
(52) U.S. Cl. .................................... 439/76.1; 439/932
(58) Field of Classification Search ............... 439/76.1, 439/72.2, 578, 579, 583–585, 932
See application file for complete search history.

(56) References Cited

U.S. PATENT DOCUMENTS 4,306,760 A * 12/1981 Testa .......................... 439/468
4,464,540 A * 8/1984 Reeder ....................... 174/35 C
6,893,273 B1 * 5/2005 Sato et al. ..................... 439/98
7,004,789 B1 * 2/2006 Kameyama et al. ......... 439/587
2004/0087192 A1 * 5/2004 Ohta et al. .................. 439/76.1

FOREIGN PATENT DOCUMENTS

JP   2000-216607   8/2000
JP   2000-332454   11/2000

* cited by examiner

*Primary Examiner*—Hien Vu
(74) *Attorney, Agent, or Firm*—Brinks Hofer Gilson & Lione

(57) ABSTRACT

An on-vehicle electronic circuit unit has cut grooves having openings that are formed by opening one end of each side plate of a frame. Therefore, a cable can be fitted into the cut groove from the opening side by pressing to be held (mounted) therein with a simple mounting operation. Thus, it is possible to improve productivity and to reduce manufacturing costs. In addition, since the cable is provided with an elastic heat shrinkable tube, the heat shrinkable tube is easily attached to the cable, and thus the manufacturing costs are reduced. Also, since the cable is stably held in the cut groove by the elasticity of the heat shrinkable tube, it is possible to firmly mount the cable.

5 Claims, 5 Drawing Sheets

ON-VEHICLE ELECTRONIC CIRCUIT UNIT

This application claims the benefit of priority to Japanese Patent Application No. 2004-168789 filed on Jun. 7, 2004, herein incorporated by reference.

BACKGROUND OF THE INVENTION

1. Field of the Invention

The present invention relates to an on-vehicle electronic circuit unit suitable for satellite and terrestrial digital audio receivers used for an automobile.

2. Description of the Related Art

A conventional electronic circuit unit is described below with reference to FIG. 9. FIG. 9 is a cross-sectional view showing the main parts of the conventional electronic circuit unit, and FIG. 10 is an enlarged cross-sectional view showing the mounting state of a cable in the conventional electronic circuit unit.

Next, the structure of the conventional electronic circuit unit is described with reference to the FIGS. 9 and 10. A box-shaped frame 52 which has upper and lower surfaces opened is enclosed in a box-shaped chassis 51, and the frame 52 has a plurality of side plates 52a and a through hole 52b provided in the side plate 52a.

A circuit board 53 has a wiring pattern 54 and various electronic components (not shown) mounted thereon, and a desired electronic circuit is formed on the circuit board 53. The circuit board 53 is mounted in the frame 52.

A lead cable 55 is composed of a coaxial cable, and has a core wire 56, an insulating coating portion 57 for covering the core wire 56, a reticulated outer conductor 58 provided on the insulating coating portion 57, a cylindrical member 59 embedded in an outer peripheral portion in the vicinity of one end of the outer conductor 58, and a heat shrinkable tube 60 embedded in the outer conductor 58 to mount the cylindrical member 59.

The cable 55 is mounted in the frame 52 by inserting the cable 55 into the through hole 52b from the outside of the frame 52, by soldering the cylindrical member 59 to the side plate 52a, and by soldering the core wire 56 to the wiring pattern 54 (for example, see Japanese Unexamined Patent Application Publication No. 2000-332454).

However, in order perform a mounting operation for mounting the cable 55 on the conventional electronic unit, it is necessary to perform an inserting operation for inserting the cable 55 into the through hole 52b of the frame 52 and a soldering operation for soldering the cylindrical member 59 to the side plate 52a. Accordingly, the mounting operation of the cable 55 has low productivity and high manufacturing costs due to the complicated mounting operation.

In the conventional electronic circuit unit, the mounting operation for mounting the cable 55 on the frame 52 needs the inserting operation for inserting the cable 55 into the through hole 52b of the frame 52 and the soldering operation for soldering the cylindrical member 59 to the side plate 52a. Therefore, the complicated mounting operation causes low productivity and high manufacturing costs.

SUMMARY OF THE INVENTION

Therefore, the present invention has been made to solve the above-mentioned problems, and it is an object of the invention to provide an on-vehicle electronic circuit unit having a simple mounting structure, high productivity, and low manufacturing costs.

According to an aspect of the invention, an on-vehicle electronic circuit unit includes a frame surrounded by four side plates; a circuit board that is provided in the frame and that has a wiring pattern and electronic components mounted thereon; and cables that are connected to the wiring pattern and that are held by cut grooves provided in the side plates of the frame. In the on-vehicle electronic circuit unit, each cut groove extends toward the circuit board and has an opening formed by opening one end of the side plate. In addition, each cable includes a core wire, an insulating coating portion for covering the core wire, and an elastic heat shrinkable tube which is attached to a part of the outer circumference of the insulating coating portion, and has an outer diameter larger than that of the insulating coating portion. The heat shrinkable tube is fitted into the cut groove from the opening side, and is held in the cut groove in a press-fitted state.

Further, in the above-mentioned structure, it is preferable that each of the cutting grooves include a groove part linearly extending from the opening toward the circuit board and a circular through hole that communicates with one end of the groove part and that has a diameter larger than the width of the groove part, and that the heat shrinkable tube be held in the through hole in the press-fitted state.

Furthermore, in the above-mentioned structure, preferably, a notch portion is provided in an edge of the circuit board at a position adjacent to the side plate, and the cable is connected to the wiring pattern in a state in which the insulating coating portion or/and the heat shrinkable tube are located in the notch portion.

Moreover, in the above-mentioned structure, preferably, the cables include a power supplying cable that connects a radiating conductor for an antenna provided on a glass plate of an automobile and the wiring pattern to a lead cable that connects the wiring pattern to electronic devices provided in the automobile. Also, the heat shrinkable tubes are provided in the insulating coating portions of the lead cable and the power supplying cable, respectively. The lead cable and the power supplying cable are held by press-fitting the heat shrinkable tubes in the cutting grooves, respectively.

Further, in the above-mentioned structure, it is preferable that the circuit board further include an amplifying circuit for amplifying power to be supplied to the radiating conductor.

DESCRIPTION OF THE PREFERRED EMBODIMENT

Figure 1:
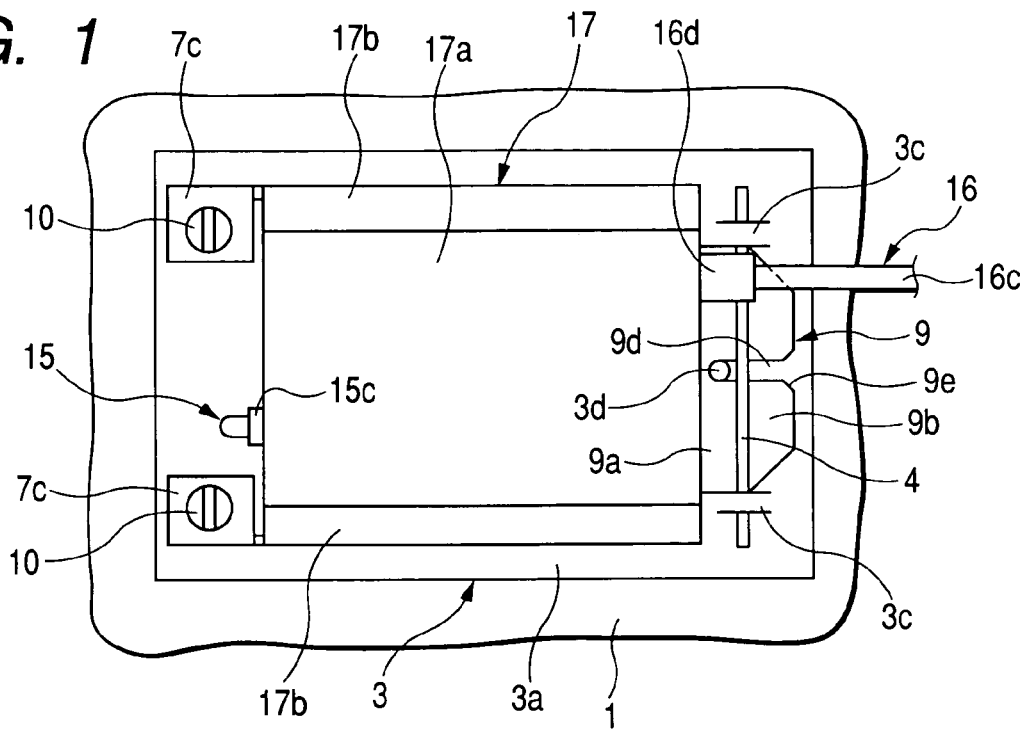
FIG. 1 is a plan view showing an on-vehicle electronic circuit unit according to the invention.
Figure 2:
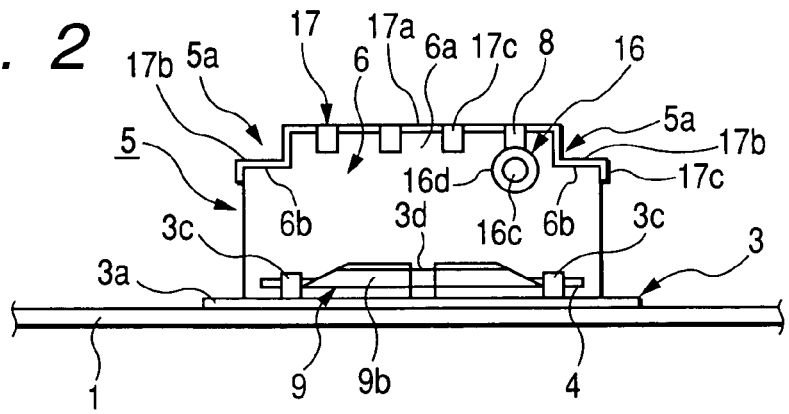
FIG. 2 is a right side view of the FIG. 1.
Figure 3:
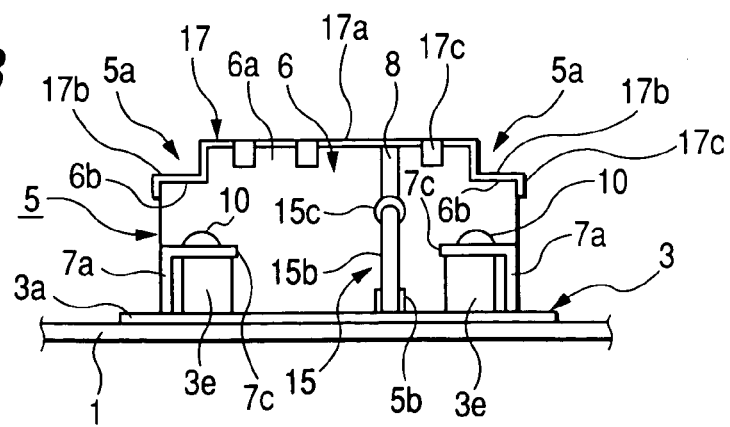
FIG. 3 is a left side view of the FIG. 1.
Figure 4:
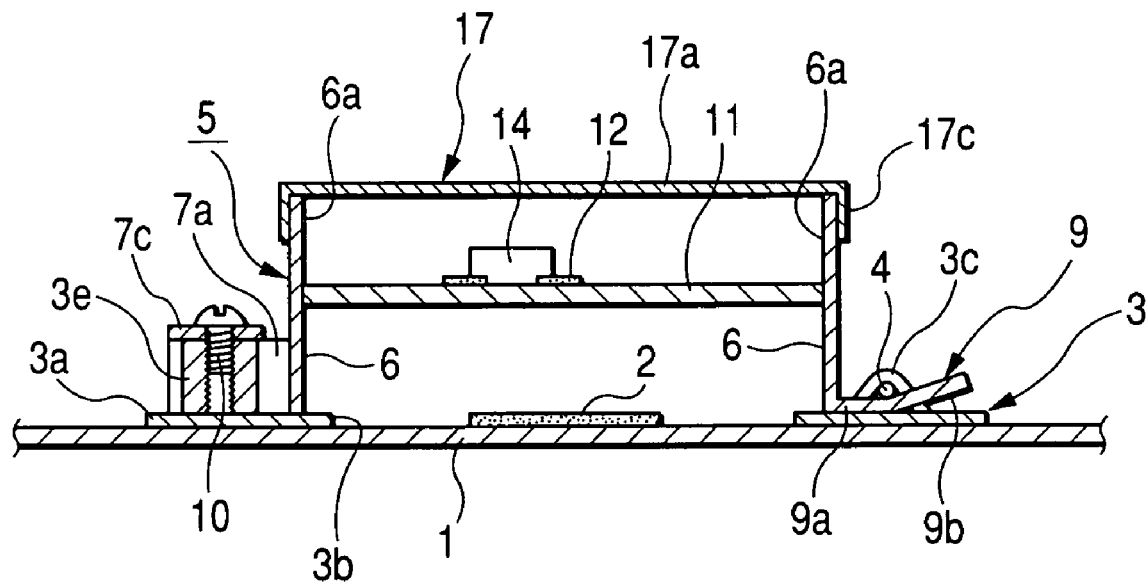
FIG. 4 is a cross-sectional view showing the main parts of the on-vehicle electronic circuit unit according to an embodiment of the invention.
Figure 5:
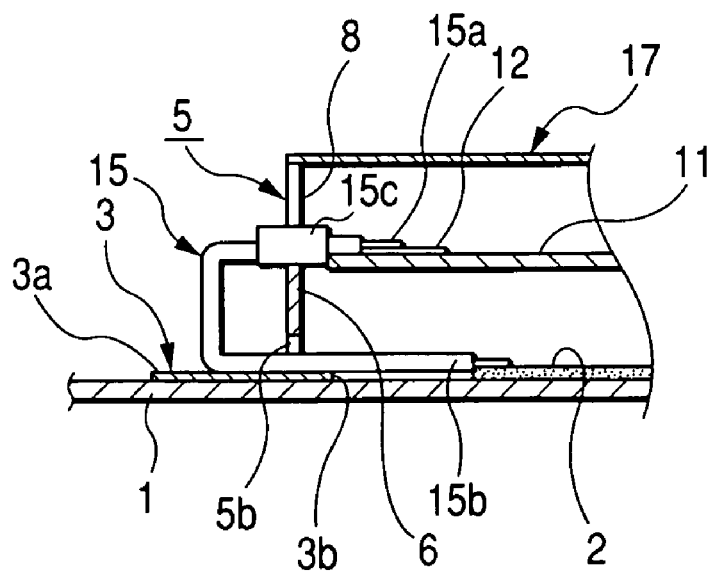
FIG. 5 is a cross-sectional view showing the mounting state of a cable in the on-vehicle electronic circuit unit according to the embodiment of the invention.

Preferred embodiments of an on-vehicle electronic circuit unit according to the invention will be described below with reference to the accompanying drawings. FIG. 1 is a plan view showing an on-vehicle electronic circuit unit according to the invention, and FIG. 2 is a right side view of the FIG. 1. FIG. 3 is a left side view of the FIG. 1, and FIG. 4 is a cross-sectional view showing the main parts of the on-vehicle electronic circuit unit according to the invention. FIG. 5 is a cross-sectional view showing the mounting state of a cable in the on-vehicle electronic circuit unit according to the invention.

Figure 6:
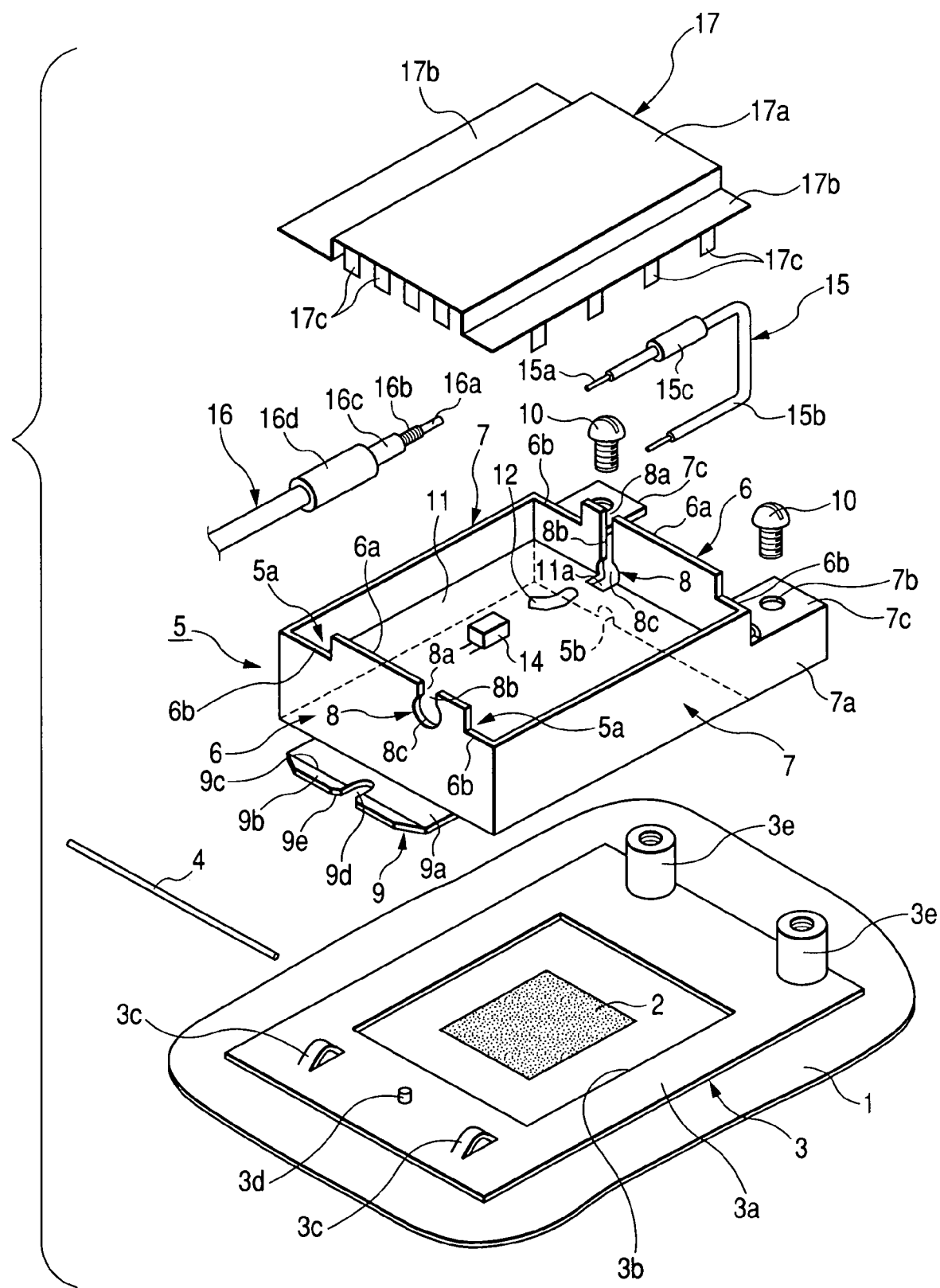
FIG. 6 is an exploded perspective view showing the on-vehicle electronic circuit unit according to the embodiment of the invention.
Figure 7:
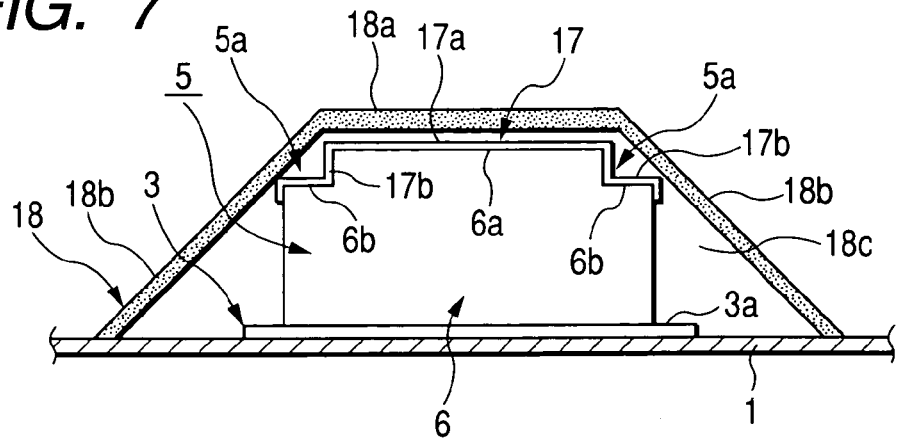
FIG. 7 is a cross-sectional view showing the arrangement state of an ornamental case in the on-vehicle electronic circuit unit according to the embodiment of the invention.
Figure 8:
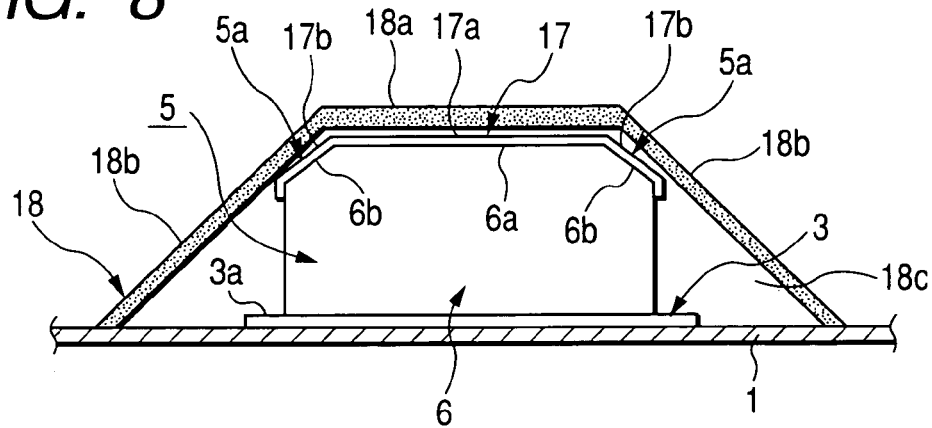
FIG. 8 is a cross-sectional view showing the arrangement state of an ornamental case in an on-vehicle electronic circuit unit according to another embodiment of the invention.
Figure 9:
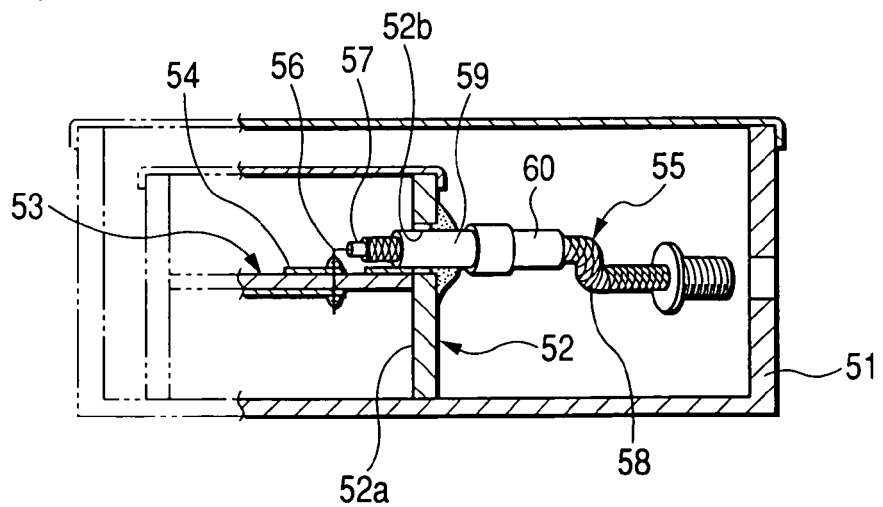
FIG. 9 is a cross-sectional view showing the main parts of a conventional electronic circuit unit.
Figure 10:
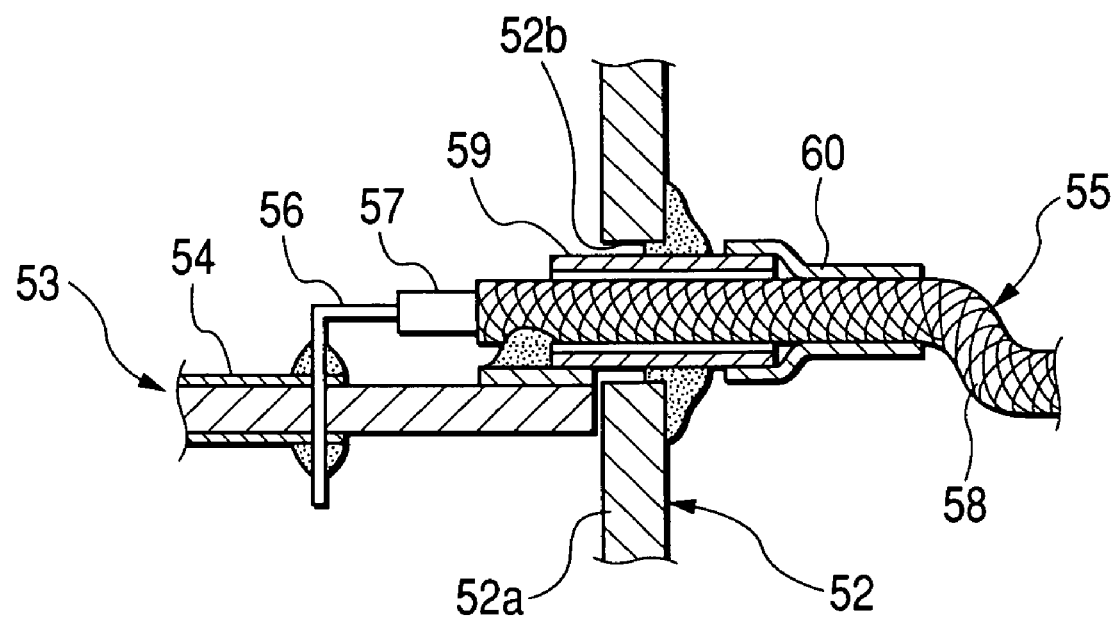
FIG. 10 is an enlarged cross-sectional view showing the mounting state of a cable in the conventional electronic circuit unit.

Also, FIG. 6 is an exploded perspective view showing the on-vehicle electronic circuit unit according to the invention, and FIG. 7 is a cross-sectional view showing the arrangement state of an ornamental case in the on-vehicle electronic circuit unit according to the invention. FIG. 8 is a cross-sectional view showing the arrangement state of an ornamental cable in an on-vehicle electronic circuit unit according to another embodiment of the invention.

Hereinafter, the structure of the on-vehicle electronic circuit unit according to the invention is described with reference to FIGS. 1 to 7. A glass plate 1 located at the rear of an automobile is provided with a radiating conductor 2, serving an antenna element constituting a part of an antenna (patch antenna). The radiating conductor 2 is provided on the glass plate 1 or on the inner surface of the glass plate 1 in the automobile.

A base plate 3 made of a metal plate has a flat base part 3a, a quadrangular hole 3b provided in the middle of the base part 3a, two locking parts 3c formed on one side of the base part 3a by cutting and raising the base plate 3a, a projecting part 3d disposed between the two locking parts 3c, and two cylindrical mounting parts 3e having thread holes, respectively, which are provided along another side of the base part 3a to face the side along which the locking parts 3c having the quadrangular hole 3b therebetween are provided.

The base plate 3 is fixed to the glass plate 1 by an adhesive or by soldering conductors (not shown) which are provided on the inner surface of the glass plate 1 in the automobile, so that the radiating conductor 2 is located in the hole 3b at the time when the base plate 3 is fixed.

A spring member 4 made of a piano wire or the like is locked by the two locking parts 3c in a state in which it set over between the two locking parts 3c formed by cutting and raising the base plate 3a.

The spring member 4 may be provided with a retaining member (not shown) such that it is retained in the locking parts 3c by bending.

A frame 5 composed of metal plates has a pair of first side plates 6 and a pair of second side plates 7, the two first plates 6 or the two second plates facing each other, and thus the frame 5 is surrounded by the four side plates. Thus, the frame 5 is formed in a rectangular box shape with the upper and lower surfaces thereof opened.

Each of the pair of first side plates 6 facing each other has a protrusion 6a provided in the middle of one end thereof and a removed portion 6b formed on both sides of the protrusion 6a by a rectangular notched portion.

The removed portions 6b are provided over the ends of the second side plates 7, respectively, and the height of the lower side of the elimination portion 6b is equal to the end of the second side plate 7. As a result, one end of the frame 5 is provided with recessed parts 5a that are recessed from both sides of the tall protrusion 6a, and the protrusion 6a of the frame 5 has a narrow top.

In addition, two cut grooves 8 are provided in the protrusions 6a of the first tall side plates 6, respectively, and the cutting grooves 8 each have an opening 8a with one end thereof opened, a groove part 8b linearly extending from the opening 8a, and a circular through hole 8c that communicates with one end of the groove part 8b and that has a diameter larger than the width of the groove part 8b.

Further, one of the first side plates 6 is provided with a plate-shaped tongue 9 which is bent from one end of the frame 5 opposite to the protrusion 6a and which protrudes from the frame 5 to the outside. The tongue 9 has a wide part 9a, a trapezoidal tapered tip part 9b formed to narrow the width thereof toward the tip, a bent part 9c that is bent so as to lift the tapered tip part 9b, a cut groove part 9d formed over the wide part 9a from the tapered tip part 9b, and a sloped part 9e formed to widen the width thereof toward the tip.

Furthermore, the second side plates 7 have a pair of leg parts 7a linearly projecting from one first side plate 6 facing the other first side plate 6 having the tongue 9 and supporting pieces 7c that are bent from the leg parts 7a at a right angle and that have holes 7b in the middle thereof, respectively. The supporting pieces 7c are provided within the height range of the first and second side plates 6 and 7.

First, the frame 5 having the above-mentioned construction is press-fitted between the base part 3a and the spring member 4 so that the tapered tip part 9b of the tongue 9 resists the elasticity of the spring member 4 by locating the projecting part 3d in the cut groove part 9d of the tongue 9 and by guiding the projecting part 3d.

In this case, it is easy to fit the projecting part 3d into the cut groove part 9d by the sloped part 9e provided at the tip part of the cut groove part 9d, and to press-fit the tongue 9 between the base plate 3a and the spring member 4 by the bent part 9c.

Next, when the frame 5 is pressed against the glass plate 1 after completing the press-fitting operation of the tongue 9, the supporting pieces 7c are placed on the mounting members 3e, respectively. In this state, the mounting of the frame 5 is completed by fastening screws 10 into the thread holes of the mounting members 3e through the holes 7b, respectively.

One side of the frame 5 is supported by the screws 10, and the other side thereof is supported by the elasticity of the spring member 4.

According to the above-mentioned mounting structure of the frame 5, since the screws 10 are easily fastened on one side of the frame 5, workability is improved. Also, it is possible to easily remove the frame 5 by loosening the screws 10 from the mounting members 3e.

A circuit board 11 composed of a printed board has a notch portion 11a provided one edge thereof, a wiring pattern 12 provided on one surface thereof, and various electronic components 14 mounted on one surface thereof. Also, a desired electric circuit including an amplifying circuit is formed on the circuit board 11.

The circuit board 11 is mounted in the frame 5 by suitable means, such as soldering or a bent piece (not shown). When the circuit board 11 is mounted in the frame 5, the notch portion 11a faces at least one cut groove 8, and at least one tall electronic component 14 located on one surface (upper surface) is disposed between the tall protrusions 6a of the first side plates 6.

A power supplying cable 15 has a core wire 15a, an insulating coating portion 15b for covering the core wire 15a, and an elastic heat shrinkable tube 15c which is attached on a part of the outer circumference of the insulating coating portion 15b and which has an outer diameter larger than that of the insulating coating portion 15b.

In the power supplying cable 15, one end of the core wire 15a is connected to the radiating conductor 2, and the heat shrinkable tube 15c is press-fitted in the through hole 8c from the opening 8a of the cut groove 8 through the groove part 8b and is held in the through hole 8c in the state in which a part of the power supplying cable 15 protrudes to the outside through the notch portion 5b of the frame 5.

In this case, the insulating coating portion 15b or/and the heat shrinkable tube 15c is/are located in the notch portion 11a of the circuit board 11, and the other end of the core wire 15a is connected to the wiring pattern 12. A patch antenna is formed by the power supplying cable 15, the radiating conductor 2, and a grounding conductor (not shown).

A lead cable 16 is made up of a coaxial cable, and has a core wire 16a, a reticulated outer conductor 16b insulated from the core wire 16a, an insulating coating portion 16c for covering the outer conductor 16b, and an elastic heat shrinkable tube 16d which is attached to a part of the outer circumference of the insulating coating portion 16c and which has an outer diameter larger than that of the insulating coating portion 16b.

The core wire 16a at one end of the lead cable 16 is connected to the wiring pattern 12, and the other end of the lead cable 16 is connected to an electronic device (not shown) received in a dashboard or the like of an automobile in the state in which the heat shrinkable tube 16d is press-fitted into the through hole 8c from the opening 8a of the cut groove 8 through the groove part 8b.

A cover 17 formed by bending a metal plate has a first flat covering part 17a, second L-shaped covering parts 17b provided on both sides of the first covering part 17a, and a plurality of elastic tongues 17c extending from the edges of the first and second covering parts 17a and 17b.

The first covering part 17a is covered along the lines of the protrusions 6a, and the second covering part 17b is covered along the lines of the removed portions 6b. Accordingly, the cover 17 covers the entire opened region of the frame 5.

In this case, the elastic tongues 17c come into elastic contact with the outer surfaces of the tall protrusions 6a and the outer surface of the second short side plate 7, so that the cover 17 is mounted on the frame 5.

Furthermore, when the cover 17 covers the frame 5, the first covering part 17a of the cover 17 has a small area since the recessed parts 5a whose corner portions are recessed along the second side plates 7 are provided at both sides of each of the protrusions 6a.

An ornamental case 18 formed, for example, by molding a synthetic resin has a trapezoidal shape, and includes a flat top part 18a, side parts 18b extending from the perimeter of the top part 18a to broaden toward the end thereof, and a receiving part 18c surrounded by the top part 18a and side parts 18b, as shown in FIG. 7.

The ornamental case 18 is removably mounted on the glass plate 1 by suitable means, with the base plate 3, the frame 5 and the cover 17 encased in the receiving part 18c.

Accordingly, the entire electronic circuit unit is covered with the ornamental case 18, resulting in a good appearance.

In addition, when the ornamental case 18 is mounted, the side parts 18b extend to broaden toward the end thereof so that the top part 18a is located over the protrusions 6a and the first covering part 17a, and the vicinities of the upper ends of the side parts 18b are located over the recessed parts 5a.

As a result, since the top part 18a having a small area projects toward the inside of the automobile, it is possible to enlarge the inner space of the automobile, and to obtain an inner space suitable for loading baggage or the like in the vicinity of the glass plate 1 in the automobile.

Moreover, FIG. 8 shows another embodiment of the on-vehicle electronic circuit unit according to the invention. According to this embodiment, the removed portions 6b provided in the first side plates 6 of the frame 5 are formed to be inclined from the both sides of each of the protrusions 6a to the second side plates 7, and thus the recessed parts 5a are provided at the both sides of each of the protrusions 6a. In addition, the ornamental case 18 is covered with the side parts 18b of the ornamental case 18 located facing the recessed parts 5a.

Since the other configurations of this embodiment are the same as those in the above-mentioned embodiment, the same reference numerals are given to the same components, and a description thereof will be omitted in this embodiment.

As described above, according to the invention, an on-vehicle electronic circuit unit includes a frame surrounded by four side plates, a circuit board that is provided in the frame and that has a wiring pattern and electronic components mounted thereon, and cables that are connected to the wiring pattern and that are held by cut grooves provided in the side plates of the frame. In this structure, each cut groove extends toward the circuit board and has an opening formed by opening one end of the side plate. In addition, each cable includes a core wire, an insulating coating portion for covering the core wire, and an elastic heat shrinkable tube which is attached to a part of the outer circumference of the insulating coating portion, and has an outer diameter larger than that of the insulating coating portion. Further, the heat shrinkable tube is fitted into the cut groove from the opening side, and is held in the cut groove in a press-fitted state.

Thus, since the on-vehicle electronic circuit unit has the cutting grooves each having an opening that is formed by opening one end of each of the side plates, the cable can be fitted into the cut groove from the opening side by pressing to be held (mounted) therein with a simple mounting operation. Thus, it is possible to improve productivity and to reduce manufacturing costs.

In addition, since the cable is provided with an elastic heat shrinkable tube, the heat shrinkable tube is easily attached to the cable, and thus the manufacturing costs are reduced. Also, since the cable is stably held in the cut groove by the elasticity of the heat shrinkable tube, it is possible to firmly mount the cable.

Further, each of the cutting grooves includes a groove part linearly extending from the opening toward the circuit board and a circular through hole that communicates with one end of the groove part and that has a diameter larger than the width of the groove part, and the heat shrinkable tube is held in the through hole in the press-fitted state. Accordingly, it is possible to retain and firmly mount the cable using a groove having a small width.

Furthermore, a notch portion is provided in an edge of the circuit board at a position adjacent to the side plate, and the cable is connected to the wiring pattern in a state in which the insulating coating portion or/and the heat shrinkable tube are located in the notch portion. Therefore, it is possible to reduce the thickness of the unit by locating a part of the thickness of the cable in the diametric direction thereof within the thickness range of the circuit board.

Also, the cables includes a power supplying cable that connects a radiating conductor for an antenna provided on a glass plate of an automobile and the wiring pattern to a lead cable that connects the wiring pattern to electronic devices provided in the automobile. The heat shrinkable tubes are provided in the insulating coating portions of the lead cable and the power supplying cable, respectively. The lead cable and the power supplying cable are held by press-fitting the heat shrinkable tubes in the cutting grooves, respectively. Therefore, it is possible to securely mount the power supplying cable and the lead cable, respectively.

In addition, the circuit board further includes an amplifying circuit for amplifying power to be supplied to the radiating conductor. Therefore, it is possible to reliably supply power and to perform good signal processing.

The invention claimed is:

1. An on-vehicle electronic circuit unit comprising:
   a frame surrounded by four side plates;
   a circuit board that is provided in the frame and that has a wiring pattern and electronic components mounted thereon; and
   cables that are connected to the wiring pattern and that are held by cut grooves provided in the side plates of the frame the cut grooves being opposite to each other, the side plates containing the cut grooves being higher than the other side plates,
   wherein each cut groove extends toward the circuit board and has a hole formed by an opening that extends from one edge of the side plate,
   each cable includes a core wire, an insulating coating portion for covering the core wire, and an elastic heat shrinkable tube which is attached to a part of an outer circumference of the insulating coating portion, and has an outer diameter larger than that of the insulating coating portion, and
   the heat shrinkable tube is fitted into the cut groove from an opening side, and is held in the cut groove in a press-fitted state.

2. The on-vehicle electronic circuit unit according to claim 1,
   wherein each of the cutting grooves includes a groove part linearly extending from the opening toward the circuit board and a circular through hole that communicates with one end of the groove part and that has a diameter larger than a width of the groove part, and the heat shrinkable tube is held in the through hole in the press-fitted state.

3. The on-vehicle electronic circuit unit according to claim 1,
   wherein a notch portion is provided in an edge of the circuit board at a position adjacent to the side plate, and the cable is connected to the wiring pattern in a state in which at least one of the insulating coating portion or the heat shrinkable tube are located in the notch portion.

4. The on-vehicle electronic circuit unit according to claim 1,
   wherein the cables includes a power supplying cable that connects a radiating conductor for an antenna provided on a glass plate of an automobile and the wiring pattern to a lead cable that connects the wiring pattern to electronic devices provided in the automobile,
   the heat shrinkable tubes are provided on the insulating coating portions of the lead cable and the power supplying cable, respectively, and
   the lead cable and the power supplying cable are held by press-fitting the heat shrinkable tubes in the cutting grooves, respectively.

5. The on-vehicle electronic circuit unit according to claim 4,
   wherein the circuit board further includes an amplifying circuit for amplifying power to be supplied to the radiating conductor.

* * * * *